(12) United States Patent
Rog et al.

(10) Patent No.: US 6,437,991 B1
(45) Date of Patent: Aug. 20, 2002

(54) RADIOELECTRONIC UNIT

(75) Inventors: Andrey L. Rog, Moscow; Vitaly N. Korulin, Saint-Petersburg; Oleg D. Osipov, Saint-Petersburg; Anatoly N. Soldatenkov, Saint-Petersburg; Igor I. Ustinov, Saint-Petersburg; Victor I. Malashin, Saint-Petersburg, all of (RU)

(73) Assignee: Samsung Electronics Company, Ltd. (KR)

( * ) Notice: Subject to any disclaimer, the term of this patent is extended or adjusted under 35 U.S.C. 154(b) by 0 days.

(21) Appl. No.: 09/508,937

(22) PCT Filed: Jul. 20, 1998

(86) PCT No.: PCT/RU98/00229

§ 371 (c)(1),
(2), (4) Date: Jun. 7, 2000

(87) PCT Pub. No.: WO00/05932

PCT Pub. Date: Feb. 3, 2000

(51) Int. Cl.[7] .................................................. H05K 1/14
(52) U.S. Cl. ........................ 361/794; 361/780; 174/260; 174/261

(58) Field of Search .................................. 174/260, 261; 361/760, 772, 773, 774, 775, 776, 780, 792, 793, 794, 795

(56) References Cited

U.S. PATENT DOCUMENTS

| 5,736,796 | A | * | 4/1998 | Price et al. ................... 307/151 |
| 6,028,489 | A | * | 2/2000 | Juang et al. ................... 331/46 |
| 6,175,506 | B1 | * | 1/2001 | Takeuchi ...................... 361/794 |

* cited by examiner

*Primary Examiner*—Jeffrey Gaffin
*Assistant Examiner*—Jeremy Norris
(74) *Attorney, Agent, or Firm*—Baker & McKenzie

(57) ABSTRACT

The invention relates to electronics and can be used in construction of electronic units performing the reception and processing of signals of the satellite radio navigation systems (SRNS). The essence of the invention is that in an electronic unit comprising a multilayer printed-circuit card, the conductors intended for screening the corresponding linking signal conductor are disposed at both its external surfaces and are connected with the ground planes by means of metallized holes of interface connections made at least at the beginning and end of each screening wire to form a closed electric circuit.

5 Claims, 5 Drawing Sheets

RADIOELECTRONIC UNIT

TECHNICAL FIELD

The invention relates to electronics and can be used in electronic units intended for reception and processing of the signals of satellite radio navigational systems (SRNS).

PRIOR ART

A specific feature of the design of electronic units used for reception and processing of SRNS signals is that they have to be incorporated into different functional devices: analogue super high-frequency and high-frequency devices performing the processes of reception and conversion of SRNS signals, and various analog-digital and digital devices, such as correlators, synthesizers, synchronizers, processors performing the processes of correlation search, tracing and digital processing of the received signals. Onboard Devices of Satellite Radio Navigation, I. I. Kudryavtsev, I. N. Mishchenko, A. I. Volynkin et al. Edited by V. S. Shebashevich, Moscow, Transport, 1988, page 112, FIG. 47 and page 126, FIG. 64. Another specific feature consists in a different degree of integration of the electric components realizing the different functions mentioned above. For example, microcircuits using a small, average or large degree of integration can be used. In this connection, when such different functional units and elements are combined in a single, generally small-size structure, including such dissimilar units and elements for processing the signals, usually having different frequencies, a problem arises with their electromagnetic compatibility, and mutual effect on levels of spurious and induced interference.

One known technical solution to such a problem is the development of a multiunit (multicard) structure, where separate printed-circuit cards incorporate electronic components relating to close (homogeneous) functional groups and processing signals that are similar in type and frequency, as, for example, in the prior art structures. Onboard Devices of Satellite Radio Navigation, I. I. Kudryavtsev, I.N.Mishchenko, A. I. Volynkin et al. Edited by V. S. Shebashevich, Moscow, Transport, 1988, p. 112, FIG. 47, Patent of Russian Federation No. 2013897, H05 K 7/00, published on May 30, 1994. In this case, the problems of reducing the spurious and induced interference can be solved by rather a simple means based, for example, on intercard screening. However, this way is connected with an increase in dimensions of the structure to be developed.

When the size consideration is important, monoblock structures are used, where the heterogeneous functional units and elements are incorporated within the framework of a common design unit, i.e. printed-circuit card, for example, in an electronic unit of a receiver/processor of SRNS signals, as described in Onboard Devices of Satellite Radio Navigation, I. I. Kudryavtsev, I. N. Mishchenko, A. I. Volynkin et al. Edited by V. S. Shebashevich, Moscow, Transport, 1988, p. 132, FIG. 69. The problems originating from spurious and induced interference can be solved by well-known methods consisting in screening separate functional units with corresponding metal screens.

Additional measures for reducing the spurious and induced interference may include other useful designer's technique, in particular, installation of additional external matching elements linking the printed-circuit components with the housing of the unit, for example, as in USSR Inventor's Certificate No 1826853, 05 K 5/00, published on Nov. 20, 1996, in special arrangement of the signal conductors on the printed-circuit card, like, for example, in Patent of Russian Federation No 2047947, 05 K 1/02, published on Nov. 10, 1995. See, Patent of Russian Federation No. 2013897, H05 K 7/00, published on May 30, 1994, Lund P. Precision Printed-Circuit Cards. Design and Production. oscow, Energoatomizdat, 1983, p. 112–115. A special layout of grounding and power supply conductors, for example, as in Lund P. Precision Printed-Circuit Cards. Design and Production. oscow, Energoatomizdat, 1983, p. 113–114 can also be used. In so doing there is no solution common for solving the given problem in all cases and in each concrete case use is made of a set of designer's tools ensuring the solution of the problem under particular conditions.

The selected prior art for the claimed electronic unit is the electronic unit described in Majorov S. A et al., Electronic Computers. Handbook on Design. Edited by S. A. Majorov, Moscow Sovetskoe Radio, 1975 (pp. 258–261, FIG. 12.2— prior art), p. 258–261, FIG. 12.2 consisting of a single-card structure. The electronic unit selected as a prior art is a multilayer printed-circuit card, in which the interlayer connections of printed conductors are carried out by means of metallized holes of the interlayer connections, in which the external conductive layers have conductors, bonding contact areas, and built-in electronic components, while the internal conductive layers have other conductors and metallized ground planes and power supply planes with windows around metallized holes of the interlayer connections which were not electrically connected with these planes. For example, for the case of a printed-circuit card with ten conductive layers, the ground plane and power supply plane are disposed in the fourth and fifth layers respectively.

The disposition of the ground and power supply planes in different conductive layers of the printed-circuit card in the prior art unit allows one to solve the problem of reducing the spurious and induced interference. Thus, the successful solution of this problem can be attained, if the unit includes homogeneous electronic components and the processed signals are close on frequency as, for example, in case of the digital computer.

DISCLOSURE OF THE INVENTION

The technical problem to be solved by the claimed invention consists in elimination by improved design the spurious and induced interference for a small-size electronic unit performing the function of a receiver/processor of the SRNS signals and made on one multilayer printed-circuit card carrying heterogeneous (analogue, analog digital, digital) functional electronic components having of a different degree of integration, and the frequency band of the signals processed and converted in the signal block ranges from thousands of megaherts at the input down to several hertz at the output.

Solving this problem allows the existing elemental base for design of small-size navigational receivers/processors intended for mass customers dealing with SRNS "GLOSNASS" and "NAVSTAR" signals.

PREFERABLE EMBODIMENTS OF THE INVENTION

The essence of the invention is an electronic unit comprising a multilayer printed-circuit card, in which the interlayer connections of the printed conductors are carried out by means of metallized holes of interface connections, in which the external conductive layers have conductors, bonding contact areas and electronic components, while the internal conductive layers have conductors and metallized ground and power supply planes with windows around the metallized holes of interface connections which are not electrically connected with these planes. The electronic components and printed conductors of the card are grouped together in three serially located zones, first of which corresponds to the zone of allocation of the electronic components performing the analog conversion of signals from the satellite radio navigational systems; the second one corresponds to the zone of allocation of the electronic components realizing the analog-digital conversion of signals; and the third one corresponds to the zone of allocation of the electronic components performing the digital conversion of signals.

The electronic components are mounted on a printed-circuit card with six conductive layers. In the second internal conductive layer ground planes of each of the zones are formed. In the third conductive layer power supply conductors of the first and second zones and additional conductors of the third zone are formed. In the fourth conductive layer additional conductors of the first and second zones and a metallized power supply plane of the third zone are formed. In the fifth conductive layer a ground plane of the first zone and additional conductors of the second and third zones are formed. In such a case, the ground planes made in the second conductive layer of the card are interconnected by means of direct ground linking conductors located according to the layout of the linking signal conductors. Electric connections are made in the external first and sixth conductive layers of the card, with the first zone being surrounded along its perimeter by screening wires placed opposite to each other on the first and sixth conductive layers of the card. The screening wires are connected to each other and to the ground planes of the given zone in the second and fifth conductive layers of the card by means of metallized holes made in the interface connections to form a closed electric circuit. The screening wires have breaks for passing the respective linking signal conductors, the points of breaks of the screening wires in the first and sixth conductive layers of the card correspond to the continuous metallized portions of the ground planes in the second and fifth layers of the card.

In the claimed electronic unit the width of the ground linking conductors performing the interconnection of the ground planes in the second conductive layer of the card are selected to be not less than 1 mm.

In the claimed electronic unit the conductors intended for screening the corresponding linking signal conductor are placed at both sides thereof and are connected to the ground planes by means of the metallized holes of the interface connections made at least at the beginning and end of each screening wire to form a closed electric circuit, the distance between the metallized holes not exceeding 5 mm.

In the claimed electronic unit the width of the screening wires made along the perimeter of the first zone in the first and sixth conductive layers of the card is selected to be not less than 2 mm.

In the claimed electronic unit the distance between the metallized holes of the interface connections interconnecting the screening wires in the first and sixth conductive layers of the cards and to the ground planes in the second and fifth conductive layers of the card does not exceed 5 mm.

The essence of the invention, its implementation, and use in industrial application are explained using an example of a structure of an electronic unit for a navigational receiver/processor intended for determining the navigational parameters by SRNS signals of the "GLOSNASS" and "NAVSTAR" systems. The essence of the invention is illustrated by the accompanying drawings in FIGS. 1–9.

Figure 1:
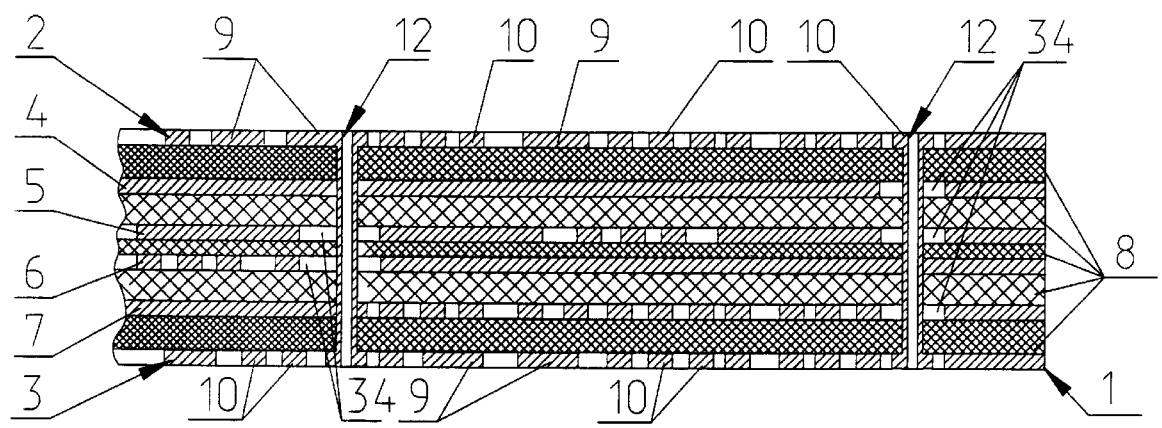
FIG. 1 is a sectional view of the printed-circuit card of a electronic unit with six conductive layers (the layout of the conductors and metallized holes of the interface connections is conditional)

The claimed electronic unit, as exemplified in FIGS. 1–9, comprises a multilayer printed-circuit card 1 with six conductive layers, whose first external conductive layer 2 will forms a face of the card 1, while the sixth external conductive layer 3 forms a back side of the card 1. The internal conductive layers of the card 1, namely, the second conductive layer 4, third conductive layer 5, fourth conductive layer 6 and fifth a conductive layer 7 of the card 1 are separated from each other and from the external conductive layers 2 and 3 by insulating layers 8 (FIG. 1).

Figure 2:
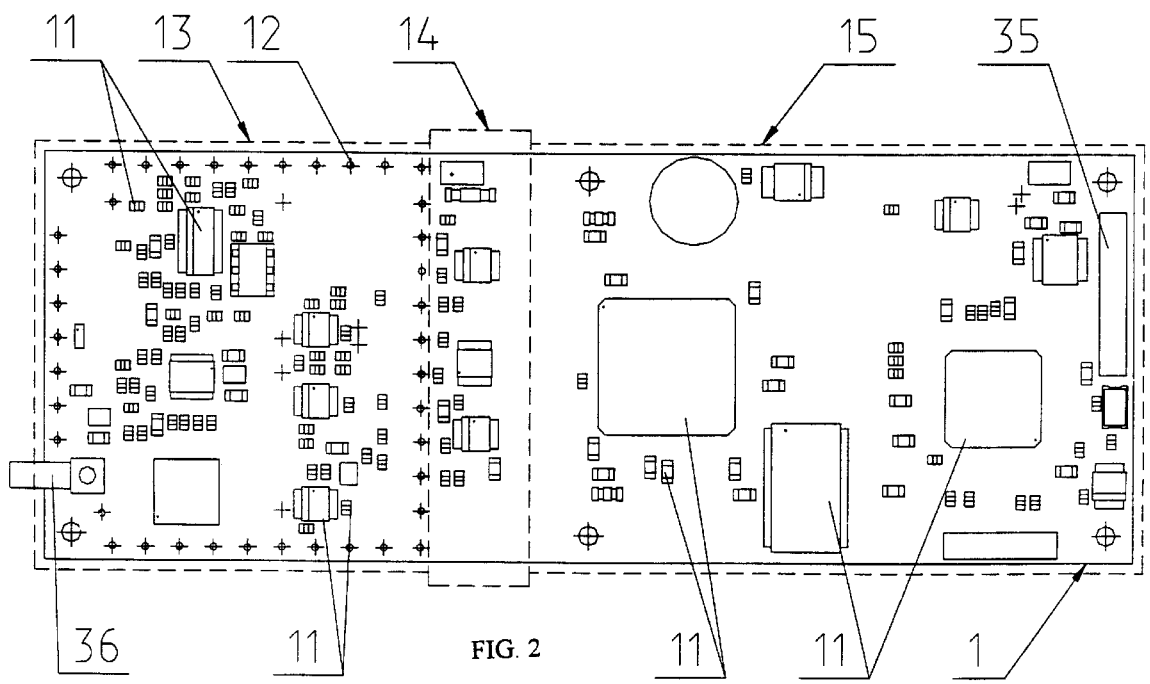
FIG. 2 illustrates an example of grouping the electronic components mounted in the first conductive layer of the card of the electronic unit in three sequentially located zones (a view from the elements of the first layer, the printed conductors are not shown)
Figure 3:
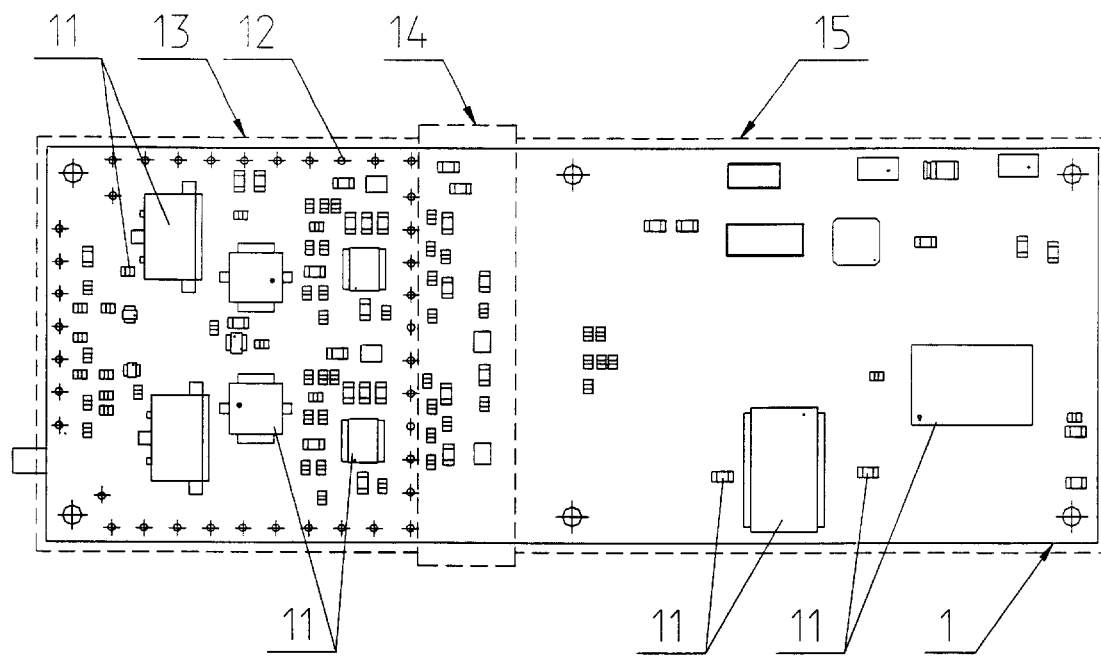
FIG. 3 is an example illustrating the grouping the electronic components mounted in the six conductive layer of the card of the electronic unit in three sequentially located zones (a view from the elements of the first layer, the printed conductors are not shown)

Formed in the external conductive layers 2 and 3 of the card 1 are printed bonding contact areas 9, printed conductors 10, and electronic components 11 (FIGS. 1–3). Formed in the internal conductive layers 4–7 of the card 1 are printed conductors only (FIGS. 5–8). The interface connections of the printed conductors of the card 1 are implemented by means of metallized holes 12 of the interface connections.

In FIG. 1, as an example of making the metallized holes 12 in the interface connections, there are shown holes connecting the conductors of the first 2, sixth 3, second 4, and fifth 7 conductive layers, as well as the first 2, sixth 3, and fourth 6 conductive layers.

The mounting of the electronic components on the card 1 is accomplished by using surface mounting technique to solve the problem of installing a great number of elements on a small area.

In the considered example of implementation of the electronic unit, i.e. The SRNS receiver/processor module, the electronic components and printed conductors of the card 1 are grouped together in three sequentially located zones 13, 14 and 15 (FIGS. 2–9).

The first zone 13 of the card 1 corresponds to the zone of allocation of the electronic components performing the analog conversion of the SRNS signals, for example, of the electronic components of a low degree of integration similar to chips of the MGA-87563 HEWLETT-PACKARD type, and the electronic components of a moderate degree of integration similar to chips of the MC13142D MOTOROLA and UPC2753GR NEC type.

The second zone 14 the card 1 corresponds to the zone of allocation of the electronic components performing the analog-digital conversion of signals, for example, to the electronic components of a moderate degree of integration similar to chips of the MAX962ECA MAXIM type.

The third zone 15 the card 1 corresponds to the zone of allocation of the electronic components performing the digital conversion of signals, for example, to the electronic components of a super high degree of integration similar to chips of the TMS320 LC203-40 TEXAC INSTRUMENTS (processor) and ASIC SAMSUNG (digital correlator) types; the electronic components of a large degree of integration similar to chips of the KM616V1002AT-15 SAMSUNG (ROM) type; the electronic components of a moderate degree of integration similar to chips of the DS1302S DALLAS (timer) type; and the electronic components of a small degree of integration similar to chips of the MAX604CSA MAXIM (stabilizer) type.

The printed conductors of the internal conductive layers of the card 1 are distributed as follows.

Figure 5:
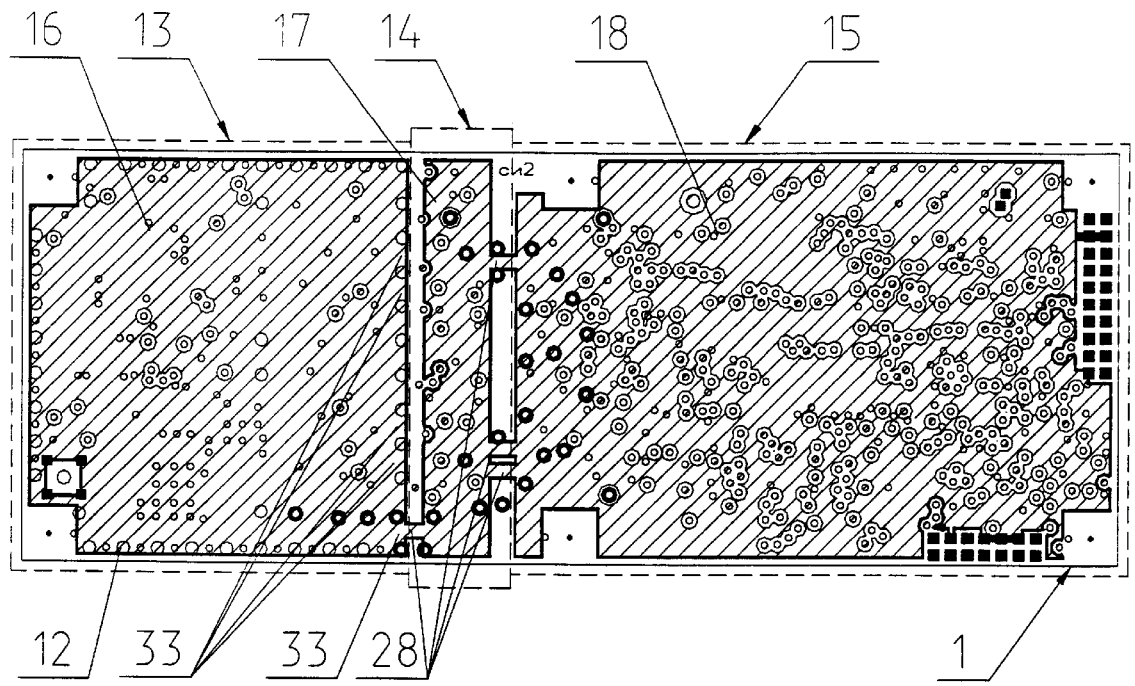
FIG. 5 is an example of a printing pattern of the second conductive layer of the card of the electronic unit (a view on the side of the first layer, the layers being partially cutaway)

In the second conductive layer 4 of the card 1, the ground planes 16, 17 and 18 are formed in all three zones 13, 14, 15 (FIG. 5).

Figure 6:
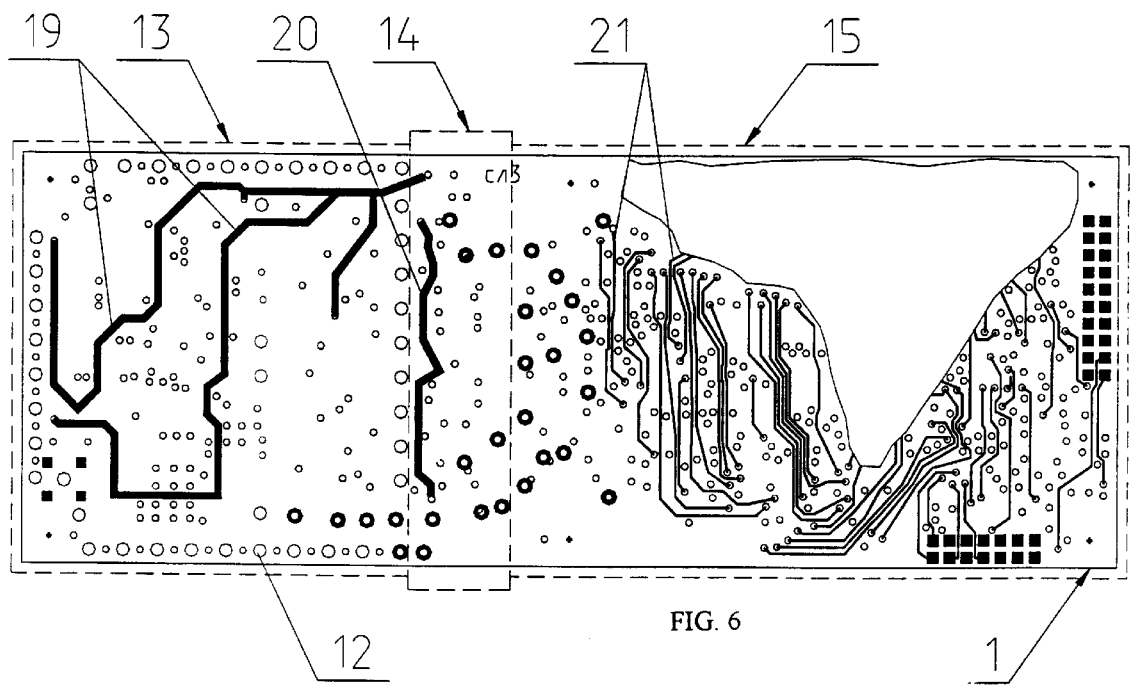
FIG. 6 is an example of a printing pattern of the third conductive layer of the card of the electronic unit (a view on the side of the first layer, the layers being partially cutaway)

In the third conductive layer 5 of the card 1, power supply conductors 19, 20 of the first and second zones 13, 14 and additional conductors of the 21 third zone 15 are formed (FIG. 6).

Figure 7:
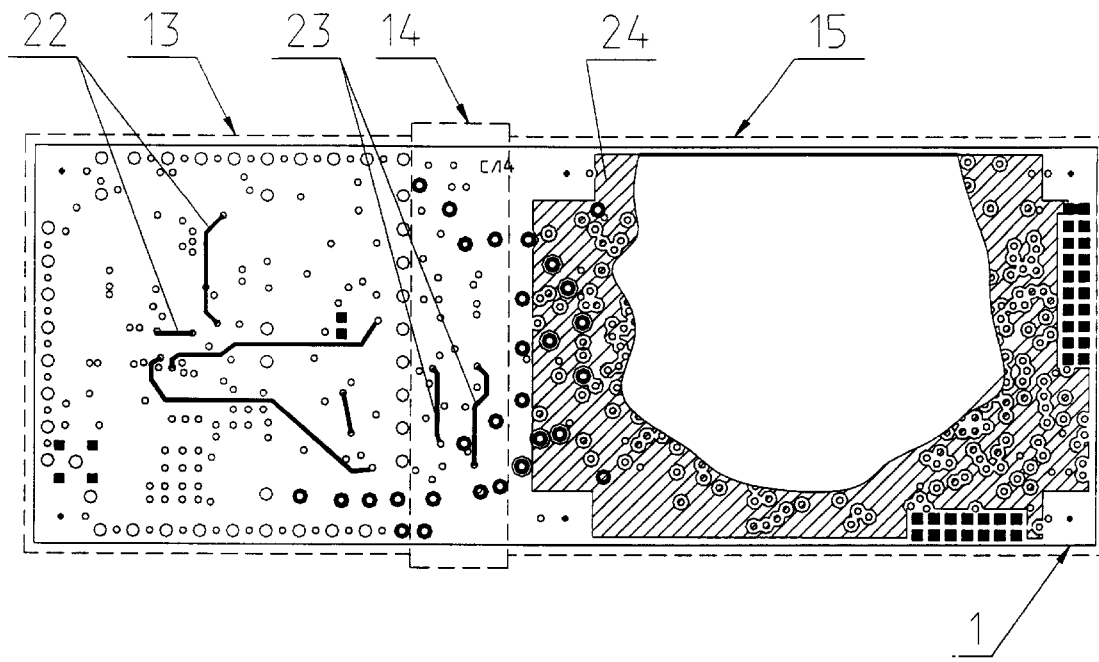
FIG. 7 is an example of a printing pattern of the fourth conductive layer of the card of the electronic unit (a view on the side of the first layer, the layers being partially cutaway)

In the fourth conductive layer 6 of the printed-circuit card 1, additional conductors 22, 23 of the first and second zones 13, 14 and metallized plane 24 of the power supply of the third zone 15 are formed (FIG. 7).

Figure 8:
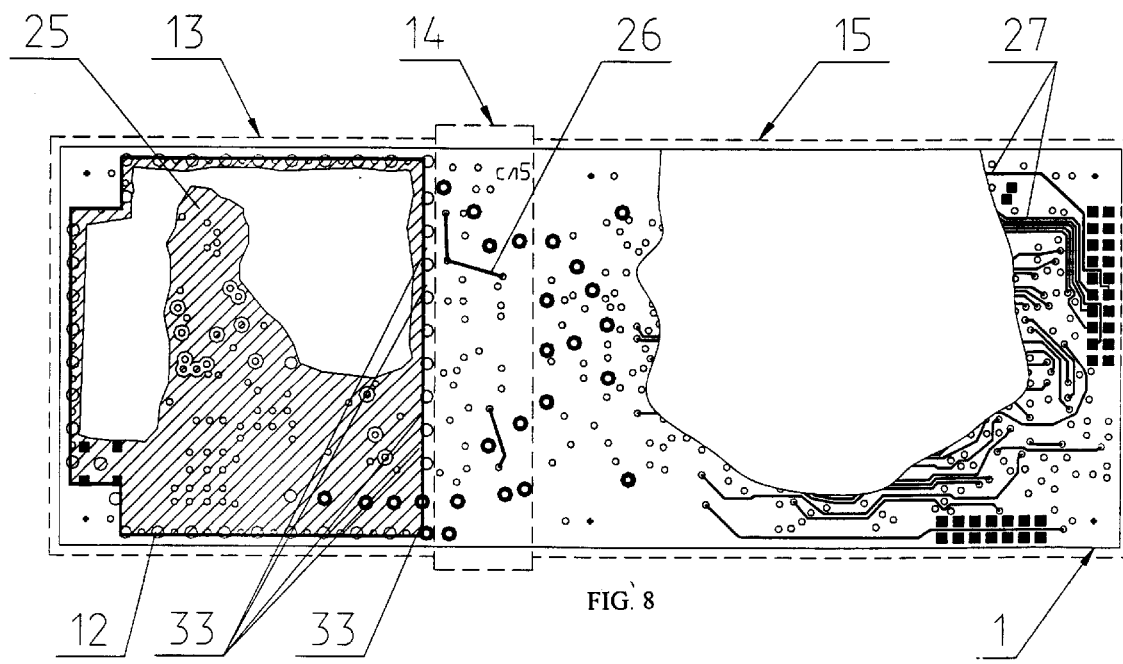
FIG. 8 is an example of a printing pattern of the fifth conductive layer of the card of the electronic unit (a view on the side of the first layer, the layers being partially cutaway)

In the fifth conductive layer 7 of the printed-circuit card 1, a ground plane 25 of the first zone 13 and additional conductors 26, 27 of the second and third zones 14, 15 are formed (FIG. 8).

The ground planes 16, 17, 18 formed in the second conductive layer 4 of the card 1 are interconnected by direct ground linking conductors 28 (FIG. 5). The width of the ground linking conductors 28 is not less than 1 mm.

Figure 4:
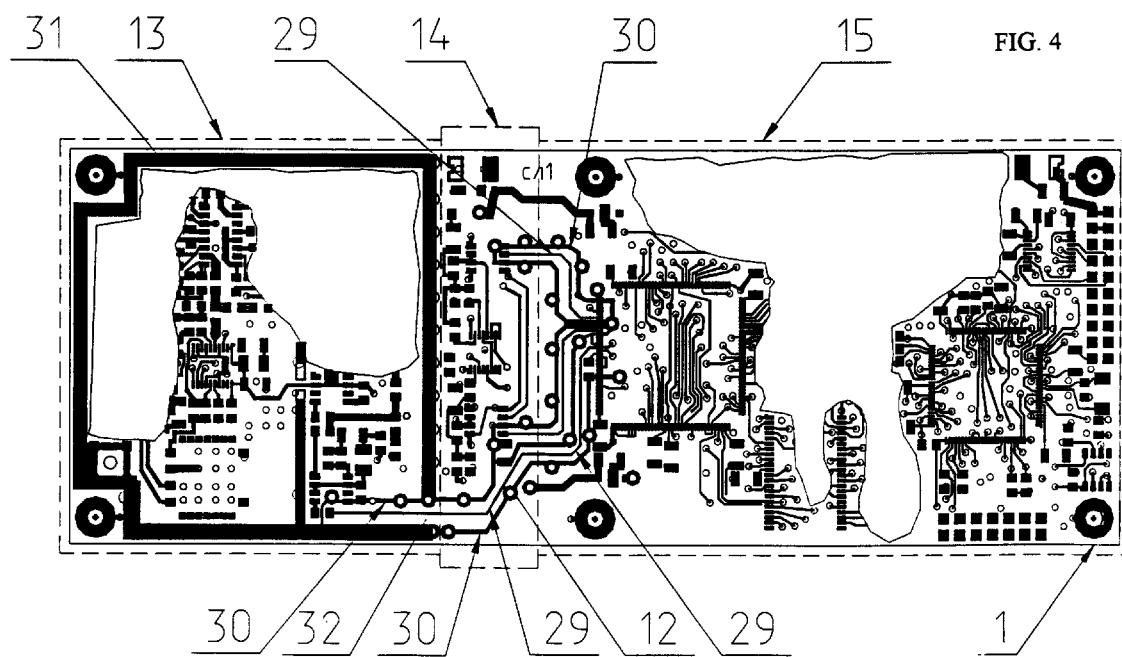
FIG. 4 is an example of a printing pattern of the first (external) conductive layer of the card of the electronic unit.
Figure 9:
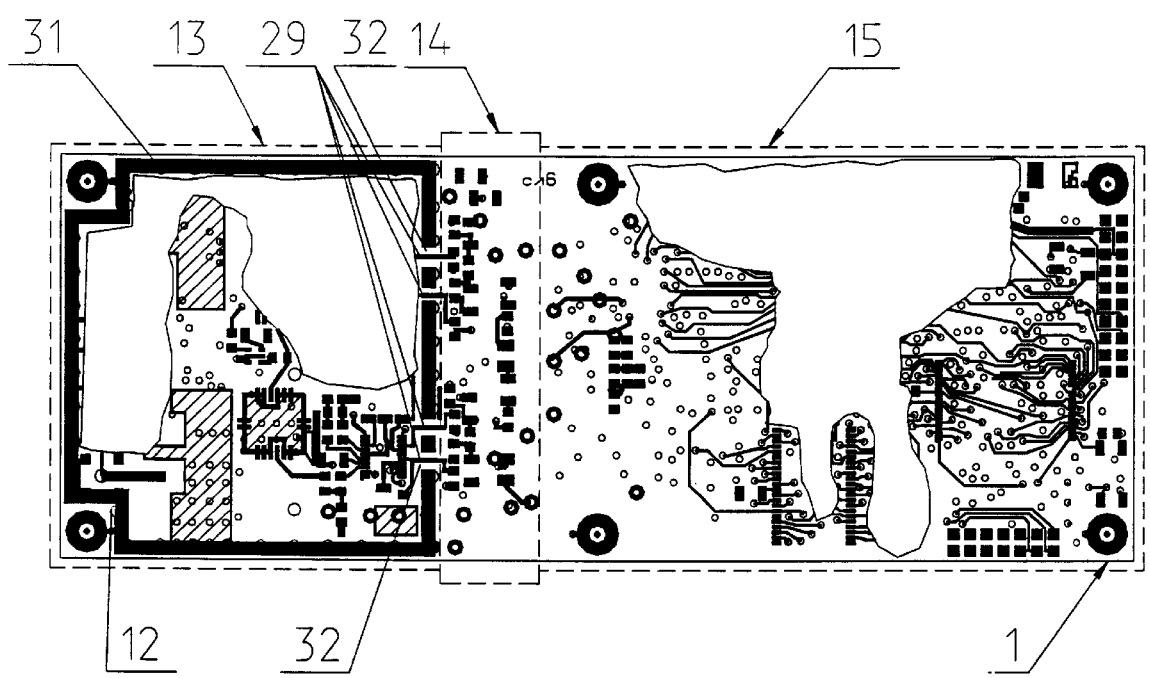
FIG. 9 is an example of a printing pattern of the sixth (external) conductive layer of the card of the SRNS electronic unit (a view on the side of the first layer, the layers being partially cutaway).

The ground linking conductors 28 (FIG. 5) are located according to the layout of the linking signal conductors 29 electrically connecting the zones in the external first 2 and sixth 3 conductive layers of the card 1 (FIGS. 4, 9).

Individual linking signal conductors 29 can be screened with the help of additional conductors 30 connected to the corresponding ground planes. Such screening can be effected, for example, with respect to the linking signal conductors carrying signals with sharp edges or having a signal level significantly differing from the signal level of the adjacent conductors. FIG. 4 shows an example of the screening of the linking signal conductors 29 located in the first conductive layer 2. The conductors 30 intended for screening a respective signal linking conductor 29 are located on both its sides and are connected to the ground planes to form a closed electric circuit. The connection to the ground planes is carried out with the help of the corresponding metallized holes of the interface connections made at least at the beginning and end of the conductors 30 at a distance of not more than 5 mm from each other.

The first zone 13 is surrounded along its perimeter by screening wires 31, located opposite to each other respectively in the first 2 and sixth 3 conductive layers of the card 1 (FIGS. 4, 9). The width of the screening wires 31 is not less than 2 mm. The screening wires 31 are interconnected and connected to the ground planes 16, 25 in the second 4 and fifth 5 conductive layers of the card 1 by means of metallized holes made therein to form a closed electric circuit. The distance between these metallized holes does not exceed 5 mm.

The screening wires 31 have breaks 32 for passing the corresponding linking signal conductors 29 (FIGS. 4, 9). The break points 32 of the screening wires 31 in the first 2 and sixth 3 conductive layers of the card 1 correspond to continuous metallized portions 33 of the ground planes 16 and 25 in the second 2 and fifth 7 conductive layers (FIGS. 5, 8).

The above-described design measures ensure necessary protection against spurious and induced interference of the electronic components in the first zone 13 which is most likely to induce noise and interference, in which case the presence of the metallized portions 33 the ground planes 16, 25, corresponding to breaks 32 in the screening wires 31 ensure optimization of the return circuits for the signal circuits performing the electrical links between the zones. These measures of protection from spurious and induced interference are most effective in combination with the claimed layout of the ground planes and power supply conductors in different conductive layers of the card, thus providing the necessary screening.

To exclude undesirable short circuits between the metallized holes 12 of the interface connections by the metallized ground planes 16–18, 25, and the power supply plane 24, at the respective places of these planes there are made windows 34 having no metal film (FIG. 1) for allocation of the metallized holes 12.

To connect the claimed electronic unit to the external output equipment and a power supply source, a low-frequency connector 35 is mounted on the face of the printed-circuit card 1 (FIG. 2).

To connect the electronic unit to a source of input signals, a high-frequency connector 36 is installed on the face of the printed-circuit card 1 (FIG. 2).

For operation of the claimed electronic unit, the connector 35 is connected to the power supply and other peripherals/ such as a control panel or an indicator of navigational parameters etc. necessary for operation of the unit. The connector 36 is connected to a source of input signals, for example, a receiving antenna cable (not shown).

The input signals of the claimed electronic unit representing analog pseudonoise (broadband) SRNS signals with frequencies in a range from 1200 MHz up to 1700 MHz are applied through the connector 36 to the electronic components of the first zone 13 of the printed-circuit card 1, where they are amplified, filtered from interference and subjected to conversion with a decrease of frequency up to dozens of megaherts. The signals thus transformed in the first zone 13 of the printed-circuit card 1 are subjected to multichannel analog-digital processing in the second functional zone 14, and then subjected to correlation processing in the digital processor formed by the electronic components of the third zone 15.

Therefore, in the claimed electronic unit the signals during the processing sequentially pass from one zone of the printed-circuit card 1 to another, undergoing changes in frequency from thousands of megaherts at the input of the first zone 13 (zone of allocation of the electronic components performing the analog conversion of signals) down to several hertz at the output of the third zone 15 (zones of allocation of the electronic components performing the digital conversion of signals).

In this case, due to a combination of the offered design measures comprising the claimed grouping of the electronic components and the printed conductors in zones, the claimed layout of the metallized ground supply planes in zones and layers of the card 1, the claimed screening of the first zone 13, as well as claimed execution of the links between the zones by means of the linking signal conductors 29 and the ground linking conductors 28, the claimed electronic unit provides suppression of the spurious and induced interference under predetermined conditions of an essential difference in a character and frequency of the signals and the degree of integration of the electronic components.

Thus, in the claimed electronic unit incorporating the offered design measures, there is provided optimization of the return circuits of passing the signals interlinking various zones, thereby minimizing the spurious induced interference in the unit. In particular, the width of the ground linking conductors 28 (not less than 1 mm) is selected from a condition of minimization of losses in return circuits of the loop for passing the signals and lowering of their susceptibility to effect of radiation and cross interference at the expense of exception of non-optimal current paths having additional inductance. The minimization of losses in the return circuits of the loop for passing the signals is also positively effected by the offered execution and layout of the metallized ground planes 16, 17, 18, 25, and metallized power supply plane 24, which provide in the claimed electronic unit the optimal return circuits corresponding to the circuits for passing the signals in the unit, exclude generation of parasitic current loops characterized by parasitic inductances and a noise sensitivity, and also ensure the minimum possible resistance to a direct current so that the voltage drop in the circuits of the card is practically excluded.

The above design parameters: a width of the screening wires 31 of not less than 2 mm, a pitch of maximum 5 mm between the metallized holes of the interface connections made in the screening wires 30 and 31, characterize the implementation of the claimed unit in the best embodiment of the invention.

Thus, the combination of the above-considered design measures allows the claimed electronic unit to solve the problem of elimination of spurious and induced interference under specific conditions, when a multilayer printed-circuit card of the unit carries different electronic components of a various degree of integration constituting a navigational SRNS receiver/processor, where the frequencies of signals being processed vary from thousands megaherts at the input down to several hertz at the output.

The experiments which have been carried out with the prototype models of the electronic units of the claimed structure have shown that the elimination of spurious and induced interference required under conditions of operation of the units processing the SRNS "GLOSNASS" and "NAVSTAR" signals in various combinations thereof and in all frequency ranges is ensured.

Therefore, it is clear from the above that the claimed electronic unit technically is feasible, can be made in an industrial scope and solves the technical problem of elimination of spurious and induced interference under specific conditions of implementation of a small-size electronic unit performing the function of a navigational SRNS receiver/processor realized on a single multilayer printed-circuit card carrying heterogeneous (analog, analog-digital, digital) functional electronic components of a different degree of integration. The frequency band of the signals to be processed and converted in the unit lies in a range from thousands of megaherts at the input to several hertz at the output.

References

1. Onboard Devices of Satellite Radio Navigation, I. I. Kudryavtsev, I. N. Mishchenko, A. I. Volynkin et al. Edited by V. S. Shebashevich, Moscow, Transport, 1988.

2. Patent of Russian Federation No. 2013897, H05 K 7/00, published on May 30, 1994.

3. USSR Inventor's Certificate No 1826853, 05 K 5/00, published on Nov. 20, 1996.

4. Patent of Russian Federation No 2047947, 05 K 1/02, published on Nov. 10, 1995.

5. Lund P. Precision Printed-Circuit Cards. Design and Production. oscow, Energoatomizdat, 1983.

6. Majorov S. A et al., Electronic Computers. Handbook on Design. Edited by S. A. Majorov, Moscow Sovetskoe Radio, 1975 (pp.258–261, FIG. 12.2—prior art).

What is claimed is:

1. An electronic unit comprising a multilayer printed-circuit card, in which the interface connections of the printed conductors are carried out by means of the metallized holes of the interface connections, in which the external conductive layers have conductors, contact areas and electronic components, and the internal conductive layers have conductors and metallized ground and power supply planes with windows around the metallized holes of the interface connections which are not electrically connected with these planes, characterized in that the electronic components and printed conductors of the card are grouped together in three sequentially located zones, first of which corresponds to the zone of allocation of the electronic components performing the analog conversion of the signals from the satellite radio navigation systems, second one corresponds to the zone of allocation of the electronic components performing the analog-digital conversion of the signals, and third one corresponds to the zone of allocation of the electronic components performing the digital conversion of the signals, the electronic components being mounted on a printed-circuit card with six conductive layers, where the internal second conductive layer has ground planes in each zone, the third conductive layer has a power supply conductors of the first and second zones and additional conductors of the third zone, the fourth conductive layer has additional conductors of the first and second zones and a metallized power supply plane of the third zone, the fifth conductive layer has a ground plane of the first zone and additional conductors of the second and third zones, in which case the ground planes made in the second conductive layer of the card are interconnected by means of direct ground linking conductors located according to the layout of the linking signal conductors effecting electrical connections between the zones in the external first and sixth conductive layers of the card, the first zone being surrounded along its perimeter by screening wires allocated opposite to each other in the first and sixth conductive layers of the card, said screening wires being interconnected and connected to the ground planes of the given zone in the second and fifth conductive layers of the card by means of the metallized holes made therein to form a closed electric circuit; said screening wires having breaks for passing the respective linking signal conductors, in which case the breaks of the screening wires in the first and sixth conductive layers of the card correspond to the continuous metallized portions of the ground planes in the second and fifth layers of the card.

2. The electronic unit according to claim 1, characterized in that the width of the ground linking conductors interconnecting the ground planes in the second conductive layer of the card is selected to be not less than 1 mm.

3. The electronic unit according to claim 1, characterized in that the conductors intended for screening the corresponding linking signal conductor are placed at both its sides and connected to the ground planes by means of the metallized holes of the interface connections made at least at the beginning and end of each screening wires to form a closed electric circuit, the distance between the metallized holes being maximum 5 mm.

4. The electronic unit according to claim 1, characterized in that the width of the screening wires made along the perimeter of the first zone in the first and sixth conductive layers of the card is selected to be at least 2 mm.

5. The electronic unit according to claim 1, characterized in that the distance between the metallized holes of the interface connections interlinking the screening conductors made along the perimeter of the first and sixth conductive layers of the card and connecting them to the ground planes in the second and fifth conductive layers of the card does not exceed 5 mm.

\* \* \* \* \*